(12) United States Patent
Luechinger et al.

(10) Patent No.: US 8,584,922 B1
(45) Date of Patent: Nov. 19, 2013

(54) ULTRASONIC BONDING SYSTEMS AND METHODS OF USING THE SAME

(71) Applicant: Orthodyne Electronics Corporation, Irvine, CA (US)

(72) Inventors: Christoph B. Luechinger, Irvine, CA (US); Orlando L. Valentin, Rancho Santa Margarita, CA (US); Tao Xu, Irvine, CA (US)

(73) Assignee: Orthodyne Electronics Corporation, Irvine, CA (US)

( * ) Notice: Subject to any disclaimer, the term of this patent is extended or adjusted under 35 U.S.C. 154(b) by 0 days.

(21) Appl. No.: 13/947,679

(22) Filed: Jul. 22, 2013

Related U.S. Application Data

(63) Continuation of application No. 13/578,702, filed as application No. PCT/US2011/030537 on Mar. 30, 2011, now Pat. No. 8,511,536.

(60) Provisional application No. 61/319,605, filed on Mar. 31, 2010.

(51) Int. Cl.
    *B23K 1/06* (2006.01)

(52) U.S. Cl.
    USPC ........ 228/1.1; 228/4.5; 228/110.1; 228/180.5

(58) Field of Classification Search
    None
    See application file for complete search history.

(56) References Cited

U.S. PATENT DOCUMENTS

| | | | |
|---|---|---|---|
| 3,821,048 A | 6/1974 | Acker et al. | |
| 3,995,845 A | 12/1976 | Scheffer | |
| 4,600,138 A | 7/1986 | Hill | |
| 4,821,945 A | 4/1989 | Chase et al. | |
| 4,976,392 A | 12/1990 | Smith et al. | |
| 5,151,377 A | 9/1992 | Hanoka et al. | |
| 5,223,070 A | 6/1993 | Tsubone | |
| 6,068,174 A | 5/2000 | Ball et al. | |
| 6,206,275 B1 | 3/2001 | Biggs | |
| 6,357,649 B1 * | 3/2002 | Okatsu et al. | 228/179.1 |
| 6,420,256 B1 | 7/2002 | Ball | |
| 6,439,448 B1 | 8/2002 | Ringler | |
| 7,595,582 B2 | 9/2009 | Ozaki et al. | |
| 8,360,304 B2 | 1/2013 | Kang et al. | |
| 2002/0179691 A1 | 12/2002 | Ball | |

(Continued)

FOREIGN PATENT DOCUMENTS

| | | |
|---|---|---|
| DE | 102009044060 | 3/2011 |
| EP | 1102331 | 5/2001 |
| JP | 2000232187 | 8/2000 |
| JP | 2006210679 | 8/2006 |

OTHER PUBLICATIONS

International Search Report dated Nov. 28, 2011; International Patent Application No. PCT/US2011/030537.

*Primary Examiner* — Kiley Stoner
(74) *Attorney, Agent, or Firm* — Christopher M. Spletzer, Sr.

(57) ABSTRACT

An ultrasonic bonding system is provided. The ultrasonic bonding system includes a bond head assembly and a bonding tool supported by the bond head assembly. The system further includes a pressing member adapted to press against a bonding material bonded using the bonding tool. The pressing member is supported by the bond head assembly and is moveable with respect to the bond head assembly independent of the bonding tool. The ultrasonic bonding system may also be an ultrasonic ribbon bonding system or a solar cell ribbon bonding system for bonding a ribbon material to portions of a solar cell.

44 Claims, 14 Drawing Sheets

(56) References Cited

U.S. PATENT DOCUMENTS

| | | |
|---|---|---|
| 2002/0185520 A1 | 12/2002 | Ball |
| 2003/0160084 A1 | 8/2003 | Higashiyama |
| 2006/0071049 A1 | 4/2006 | Farassat |
| 2006/0157532 A1 | 7/2006 | Ball |
| 2008/0073407 A1 | 3/2008 | Copperthite |
| 2009/0127316 A1 | 5/2009 | Siepe |
| 2010/0127045 A1 | 5/2010 | Cheng et al. |
| 2011/0290859 A1 | 12/2011 | Delsman et al. |

* cited by examiner

ULTRASONIC BONDING SYSTEMS AND METHODS OF USING THE SAME

CROSS-REFERENCE TO RELATED APPLICATIONS

This application is a continuation of U.S. patent application Ser. No. 13/578,702 filed Aug. 13, 2012, now U.S. Pat. No. 8,511,536, which claims the benefit of International Patent Application No. PCT/US2011/030537 filed Mar. 30, 2011, which claims the benefit of U.S. Provisional Application No. 61/319,605 filed on Mar. 31, 2010, the content of both of which is incorporated herein by reference.

FIELD OF THE INVENTION

The present invention relates to ultrasonic bonding operations, and more particularly, to wire and ribbon bonding systems for solar cells, semiconductor devices, and the like.

BACKGROUND OF THE INVENTION

In the processing and packaging of semiconductor devices, ultrasonic bonding (e.g., wire bonding, ribbon bonding, etc.) continues to be a widely used method of providing electrical interconnection between two locations within a package (e.g., between a die pad of a semiconductor die and a lead of a leadframe). For example, ribbon bonding machines are used to form ribbon interconnections between respective locations to be electrically interconnected. The upper terminal end of a bonding tool is, in many instances, configured to be engaged in a transducer (e.g., an ultrasonic transducer) of a ribbon bonding system which causes the bonding tool to vibrate upon bonding.

In providing interconnection in solar cell applications (e.g., crystalline silicon solar cells, thin film solar cells, etc.), techniques such as soldering or conductive adhesive bonding are used to electrically connect adjacent cells, to collect electricity from multiple cells, etc.

In certain applications, problems have occurred related to the bonding tool sticking to the bonded ribbon. That is, after a bond has been formed it is desired to raise the bonding tool above the bonded ribbon. If the bonding tool is stuck to (or otherwise bonded to) the ribbon material, during the lifting of the tool damage to the ribbon (or other portion of the solar substrate) may occur. For example, ribbon material stuck to the tool may pull off from the substrate, and may further tear (or otherwise damage) adjacent portions of the surrounding substrate.

Thus, it would be desirable to provide improved ultrasonic bonding systems and methods of use.

SUMMARY OF THE INVENTION

According to an exemplary embodiment of the present invention, an ultrasonic bonding system is provided. The ultrasonic bonding system includes a bond head assembly and a bonding tool supported by the bond head assembly. The system further includes a pressing member adapted to press against a bonding material bonded using the bonding tool. The pressing member is also supported by the bond head assembly and is moveable, with respect to the bond head assembly, independent of the bonding tool. The ultrasonic bonding system may also be an ultrasonic ribbon bonding system or a solar cell ribbon bonding system for bonding a ribbon material to portions of a solar cell.

According to another exemplary embodiment of the present invention, a method of bonding a ribbon to a substrate is provided. The method includes the steps of: (1) contacting a portion of a ribbon with a tip portion of a bonding tool, the ribbon overlying a portion of a substrate; (2) applying ultrasonic energy to the bonding tool to form a bond between the ribbon and the underlying substrate portion; (3) bringing a pressing member into contact with portions of the ribbon proximate the tip portion of the bonding tool; (4) maintaining contact between the pressing member and the contacted portions of the ribbon while lifting the bonding tool up from the bond until the bonding tool no longer contacts the bond; and (5) lifting the pressing member from the contacted portions of the ribbon until the pressing member no longer contacts the contacted portions of the ribbon.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

During ultrasonic bonding of a conductive material (e.g., a ribbon material) to a substrate, the ribbon is moved by a bonding tool relative to the underlying substrate to facilitate bond formation. Generally, relative motion between the bonding tool and the ribbon is undesirable. Such relative motion may cause the bonding tool to stick or become bonded to the ribbon based upon the same mechanism that bonds the ribbon to the substrate surface. If the bonding tool does stick to the ribbon during the bonding process, a portion of the ribbon (and perhaps a portion of the substrate under the ribbon and/or adjacent the ribbon) may lift up with the bonding tool (e.g., after the bonding is complete and the tool is raised), thereby damaging or even destroying the substrate. Such sticking problems may be worse during solar cell bonding (e.g., due to the mechanisms used to secure the solar substrate during bonding, for example, because of the geometry of the solar substrate). Such problems may become even worse in the future as the thickness of crystalline solar cells tends to decrease. Further still, as a bonding tool becomes increasingly contaminated during a repetitive bonding process, the sticking problems may become worse still.

According to the present invention, a pressing member is provided in connection with an ultrasonic bonding system (e.g. a wire bonding system, a ribbon bonding system, etc.). The pressing member may be supported by a bond head assembly of the bonding system, and is moveable with respect to the bond head assembly. The pressing member may be used to press against a portion of a conductor, such as a ribbon (and/or other portions of the workpiece being wire or ribbon bonded), during lift off of the bonding tool following completion of a bond. The pressing member may reduce or even eliminate lift off of the bonded ribbon (or other bonding material) from an underlying substrate, thereby reducing the potential for cracking and associated damage of the workpiece/substrate. As will be appreciated, the pressing member may include a plurality of pressing elements that may be independently moveable.

Figure 1:
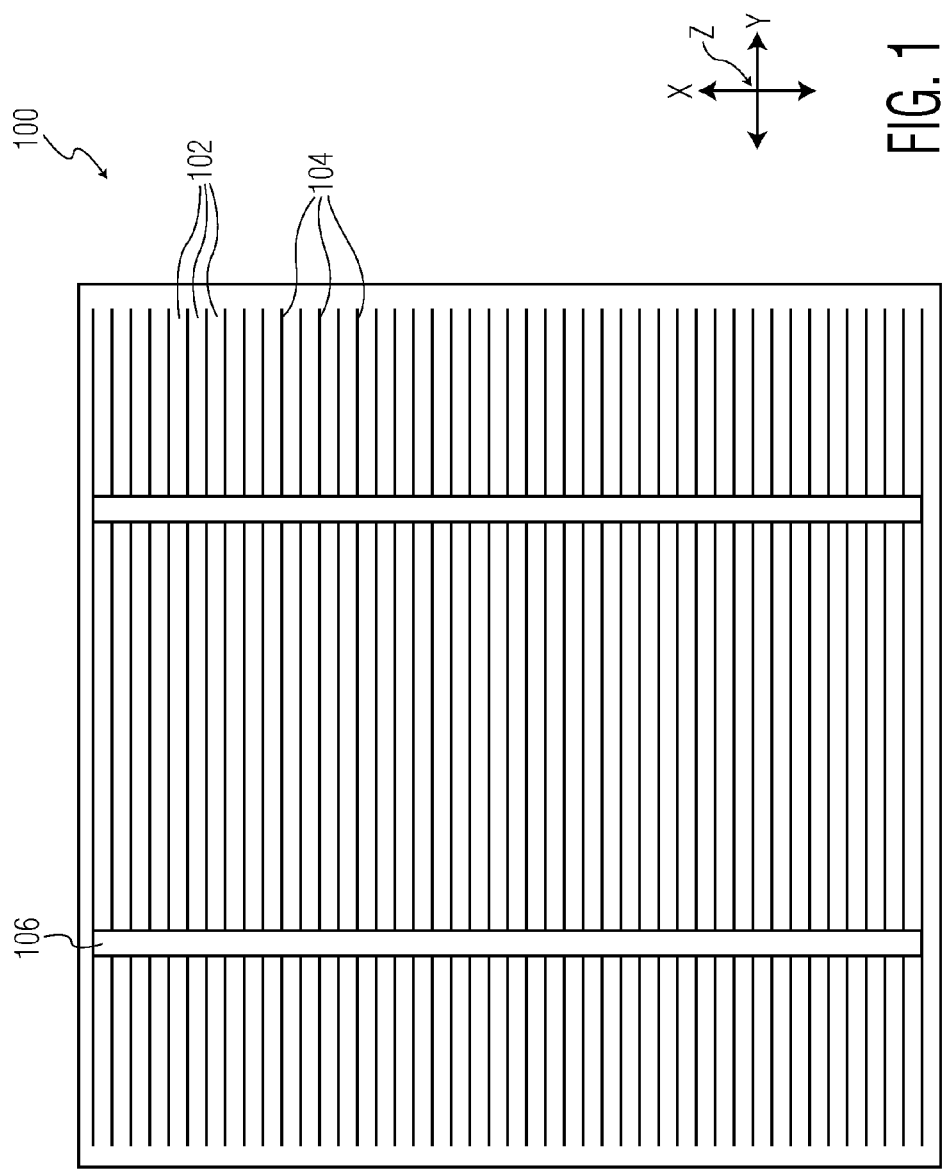
FIG. 1 is a plan view of a solar substrate.

FIG. 1 is a plan view of an example solar substrate 100 (also known as a solar cell) having active area 102 (e.g., for converting light energy into electrical energy). A number of solar substrates/cells 100 provided together may collectively be considered a solar panel. Current fingers or traces 104, and busbars 106 are provided on active area 102 of solar substrate 100, and visually divide active area 102 into a grid of active area portions. Busbars 106 extend substantially perpendicular to current fingers 104, and provide a current path for the electrical energy generated by active area 102 and gathered by current fingers 104. Current fingers 104 and busbars 106 may be formed of, for example, silver thick-film. Of course, other materials are contemplated.

For example, it may be desired to provide an electrical interconnection between (1) a busbar 106 on a front side of a first solar substrate 100 and (2) the backside of a second solar substrate (not shown). Further, it may be desired to provide an electrical interconnection between busbar 106 of a first solar substrate 100 and a current collection bus of the solar energy system. Conductive ribbons (or other interconnection materials) may be bonded to busbars 106 and other regions to provide this interconnection.

Figure 2A:
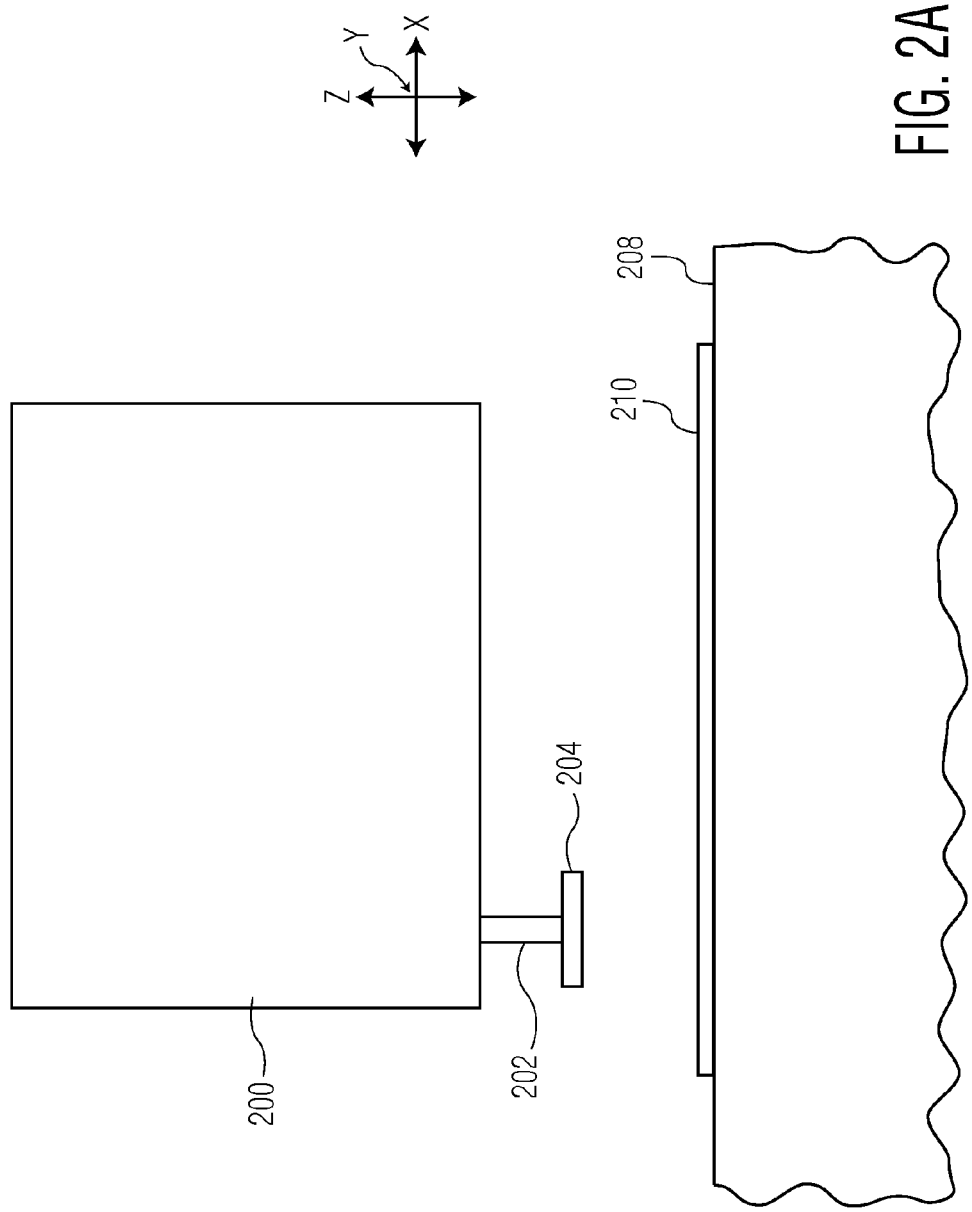
FIGS. 2A-2B are side sectional block diagram views of portions of bonding systems according to various exemplary embodiments of the present invention.

FIG. 2A illustrates bond head assembly 200 carrying pressing member 204 which is secured to actuator 202. Actuator 202 translates along the vertical Z-axis, and raises and lowers pressing member 204 against: (1) a bonding material (not shown) overlying a portion of solar substrate 210; and/or (2) solar substrate 210 itself. Solar substrate 210 is supported by bonding surface/workholder 208 and is held in place, for example, using vacuum means or a clamping structure of the workholder (neither shown). Actuator 202 may be, for example, a voice coil, a piezo, a motor, a pneumatic cylinder, amongst others.

While not shown in FIG. 2A, bond head assembly 200 may also carry a bonding tool proximate pressing member 204 (e.g., see FIG. 7) that bonds a ribbon material to a busbar of substrate 210 (e.g., see busbars 106 of FIG. 1). The bonding tool is typically secured to a transducer (e.g., see transducer 716 in FIG. 7) that introduces ultrasonic energy to the bonding tool causing the bonding tool tip portion to vibrate (e.g., to vibrate along the X-axis, the Y-axis, etc.). At the beginning of the bonding step the vibration of the tip portion (which is in contact with the ribbon material) causes relative motion between the ribbon material and the bonding location (e.g., a busbar of the solar substrate), thereby facilitating bonding.

Figure 2B:
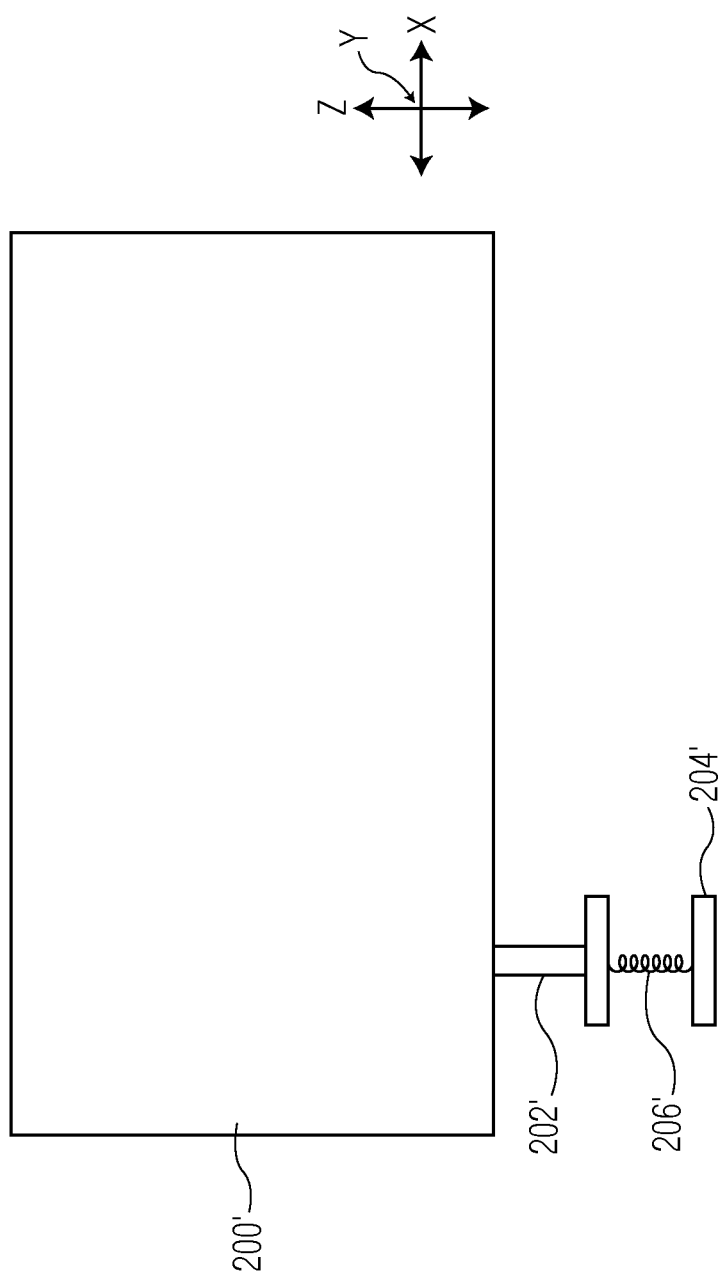

FIG. 2B illustrates bond head assembly 200' that includes compression member 206' interposed between actuator 202' and pressing member 204'. Compression member 206' may be a spring, a flexure, a hydraulic structure, etc., and may ensure that contact is maintained by pressing member 204' by compensating for small height variations between pressing member 204' and the bonding material (e.g., a ribbon), or between pressing member 204' and the substrate which carries the bonding material. Compression member 206' may also allow for the adjustment of the down hold (pressing) force. For example, compression member 206' may be used to ensure that pressing member 204' does not contact the ribbon or the substrate with so great a force that damage may occur. It is noted that if compression member 206' includes a spring, for example, it may be a fairly stiff spring to also ensure that a minimum amount of force is applied to the ribbon/substrate. A fairly stiff system may be achieved, for example, using a flexure as pressing member 204' (See FIGS. 3E-3F described below). Such a design may utilize a short travel distance to create a high force, may be self-guided, and may be designed to have a shape suitable to the application. Such a flexure design may provide relatively high pressing forces with a light weight structure.

FIGS. 3A-3F illustrate various pressing members (e.g., pressing member 204/204' shown in FIGS. 2A-2B) having a variety of shapes and forms, such as pressing members 304, 304', 304'', 304''', 304'''' in accordance with other exemplary embodiments of the present invention. Of course, other pressing member configurations are contemplated. Unless otherwise described (e.g., see pressing elements 310''', 312'' comprising pressing member 304''' shown in FIG. 3D, and flexure 310'''' shown in FIGS. 3E-3F), compression member 306 is interposed between pressing member 304, 304', 304'' of FIGS. 3A-3C and actuator 302, that is carried by bond head assembly 300. However, it should be understood that while various exemplary embodiments of the present invention are illustrated and/or described using compression members (e.g., member 306) between the relevant actuator and pressing member, such a compression member may not be desired (e.g., in a system including an actuator with integrated compliance such as a pneumatic actuator, a voice coil, etc.).

Figure 3A:
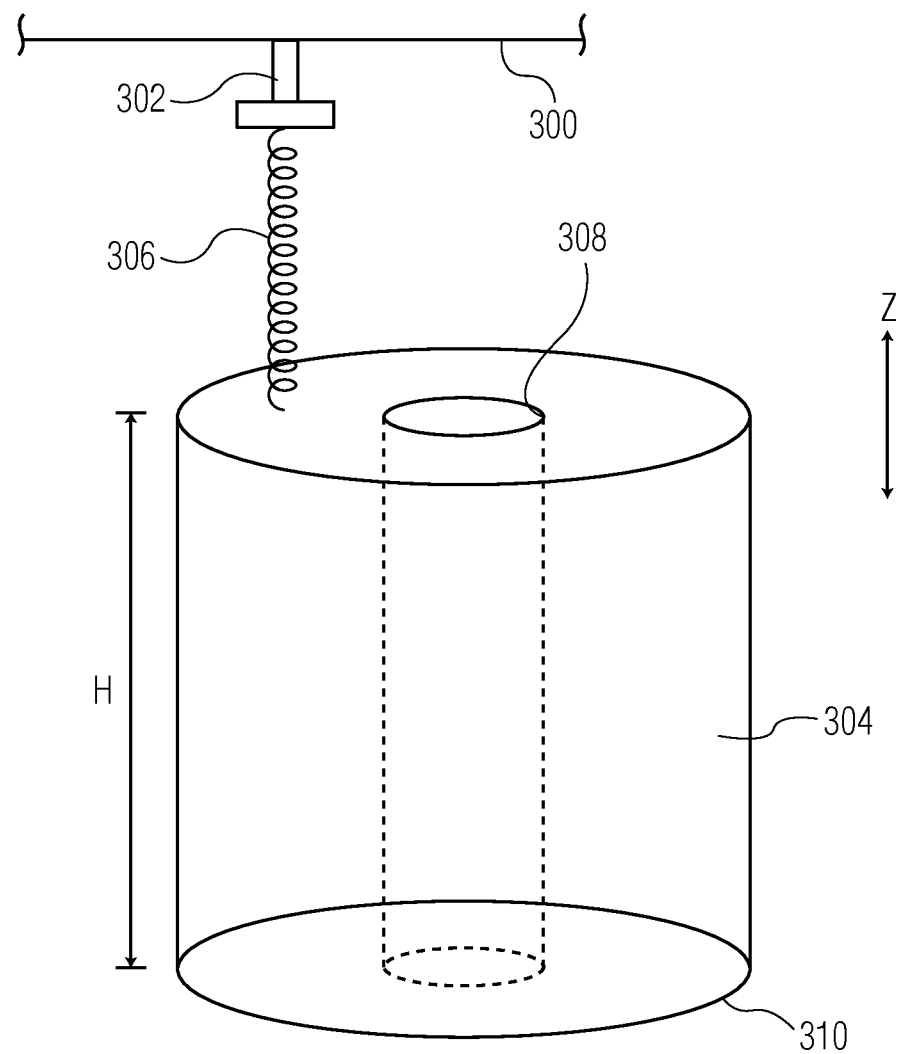
FIGS. 3A-3F are perspective block diagram views of portions of bonding systems according to various exemplary embodiments of the present invention.

Specifically, as shown in FIG. 3A, pressing member 304 may have a cylindrical shape with height H. It is noted that if height H were small enough, pressing member 304 may be considered a washer or the like. Cylindrical pressing member 304 includes bonding tool through-hole 308 within which a bonding tool (not shown) may vertically move freely and independently of pressing member 304 along the z-axis. Pressing member 304 may have any shape that is desired (e.g., a rectangular shape, etc) as opposed to the illustrated cylindrical shape. Likewise, bonding through-hole 308 may be cylindrical as shown, or may be of any shape permitting free vertical translational movement of the bonding tool.

Pressing member 304 has a lower surface 310 adapted to contact a ribbon to be bonded to an underlying substrate (e.g., a solar substrate) and/or may be adapted to contact a portion of the underlying substrate proximate the ribbon bonding site. While lower surface 310 is shown as flat in FIG. 3A, it may include protrusions adapted to contact a ribbon and/or a substrate portion proximate the ribbon bonding site. Such protrusions may have any shape or configuration desired in the given application.

Figure 3B:
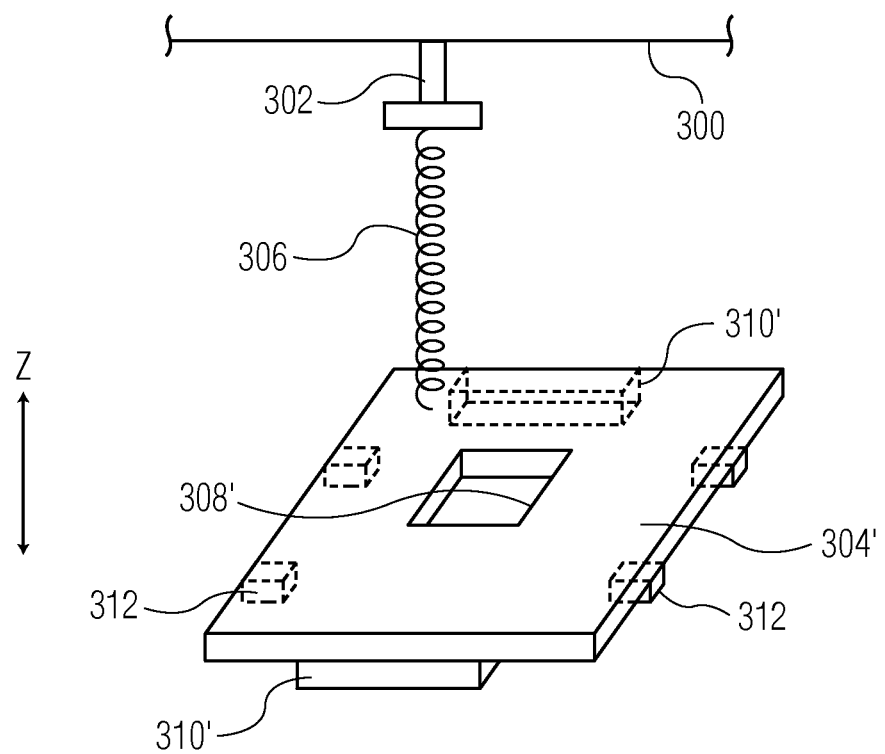

FIG. 3B illustrates pressing member 304' having a rectangular shape and defining bonding tool through-hole 308' within which a bonding tool (not shown) may vertically move freely and independently of pressing member 304' along the z-axis. Bonding through-hole 308' may be rectangular as shown, or may be of any shape permitting the free vertical translational movement of the bonding tool. Pressing member 304' includes first pair of opposing pressing elements 310' adapted to contact a ribbon, and two additional pairs of opposing pressing elements 312 adapted to contact a pair of adjacent current fingers or the active area of the substrate (e.g., see FIG. 1) adjacent the ribbon bonding site. It is noted that pressing member 304' may have either (or both of) first or second pair of pressing elements 310', 312, or, may have no pressing elements 310', 312 and may thus function as pressing member 304 with flat lower surface 310 (e.g., see FIG. 3A). As will be appreciated, the dimension (e.g., heights, widths, etc.) of pressing elements 310' and 312 may vary as desired (and may be different from one another) depending upon the application and the desired function.

Figure 3C:
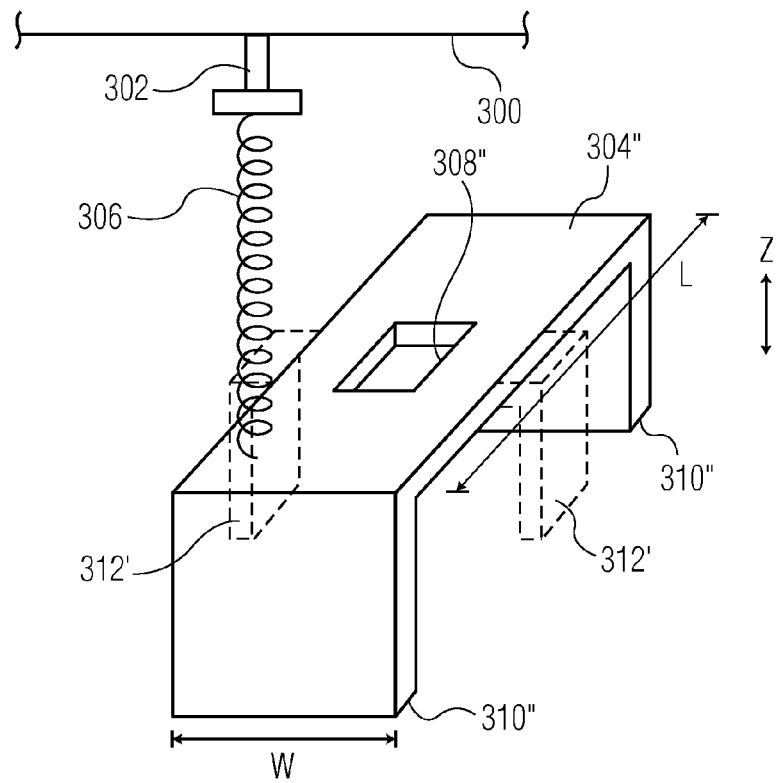

FIG. 3C illustrates U-shaped pressing member 304" with opposing legs that function as pair of pressing elements 310". Depending upon the configuration and alignment of pressing elements 310", they may be adapted to contact either a portion (s) of a ribbon to be bonded proximate the tip portion of the bonding tool and/or a substrate (e.g., a pair of adjacent current fingers, or an active area between a pair of adjacent current fingers) supporting the ribbon proximate the ribbon bonding site. U-shaped pressing member 304" has length L and width W, and includes bonding tool through-hole 308" within which a bonding tool (not shown) may vertically move freely and independently of pressing member 304" along the z-axis. Bonding through-hole 308" may be rectangular as shown, or may be of any shape permitting the free vertical translational movement of a bonding tool through hole 308". Pressing member 304" may also include optional pressing elements 312' (shown in dotted lines) which may be used to contact a portion of a substrate (e.g., an active area of the substrate, current fingers of the substrate, etc.) while pressing elements 310" contact the proximate portions of the ribbon to be bonded.

Figure 3D:
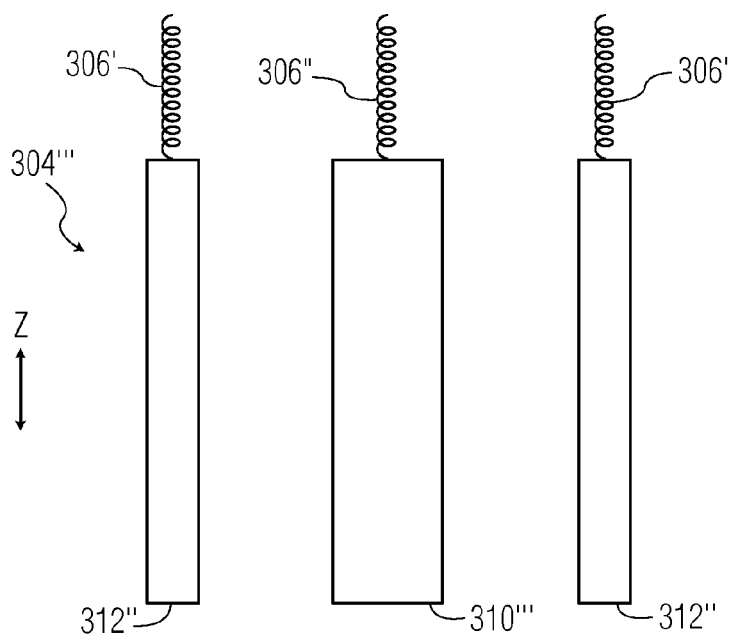

FIG. 3D illustrates pressing member 304''' including a first pair of pressing elements 310''' (with the second one masked by the one shown) adapted to contact a ribbon to be bonded, and second pair of pressing elements 312" adapted to contact the substrate adjacent the ribbon bonding site, or the ribbon in the front and back of the bonding tool. Compression members 306" (e.g., springs) are interposed between respective pressing elements 310''' and one or more actuators (not shown, but see actuator 702 of FIG. 7, e.g.). Compression members 306' (e.g., springs) are interposed between respective pressing elements 312" and another one or more actuators (not shown, but see actuator 702 of FIG. 7, e.g.). As will be described in more detail in relation to FIGS. 5 and 6, exemplary first and second pairs of pressing elements 310''', 312" may move independently of each other (or together), and are spaced apart such that a bonding tool (not shown) may vertically move freely there between, and independently of, pressing elements 310''', 312".

Figure 3E:
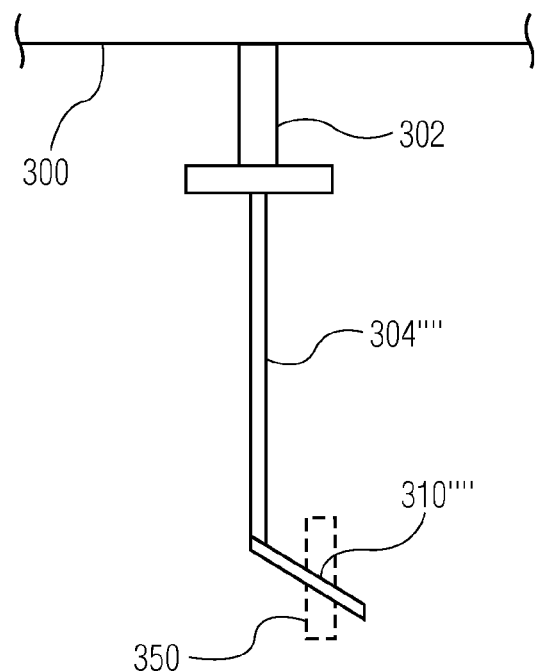
Figure 3F:
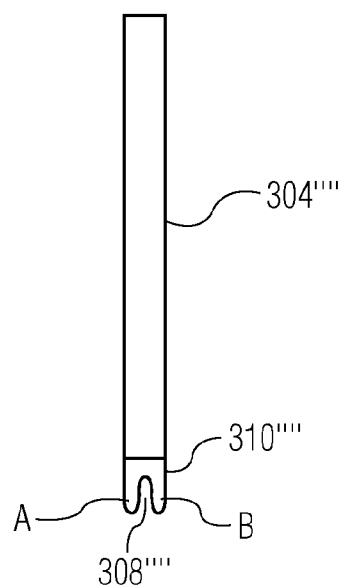

FIG. 3E illustrates pressing member 304"" including pressing element 310"" adapted to contact a ribbon to be bonded. Pressing member 304"" is driven by actuator 302 (carried by bond head assembly 300). In FIG. 3E, pressing element 310"" is a flexure, and as such, a distinct compression member (such as springs 306, 306' described above) may be omitted from the design if desired. FIG. 3F illustrates another view of a portion of pressing member 304"" (rotated 90 degrees with respect to the view shown in FIG. 3E). Pressing element 310"" defines opening 308"" for receiving or partially surrounding bonding tool 350 (where tool 350 is illustrated in dotted lines in FIG. 3E). Opening 308"" is defined between leg portions A and B of pressing element 310"". As such, respective contact portions of leg portions A and B may be used to press against the ribbon material on opposite side of bonding tool 350.

FIGS. 3E-3F illustrate one exemplary use of a flexure as the pressing element; however, it is understood that many different flexure configurations are contemplated. Further, while a single pressing element 310"" is illustrated, it is understood that any of a number of pressing elements may be provided (with or without separate actuation) as is desired in the application to contact the ribbon and/or another portion of the solar substrate (e.g., adjacent the ribbon bonding site).

Figure 4A:
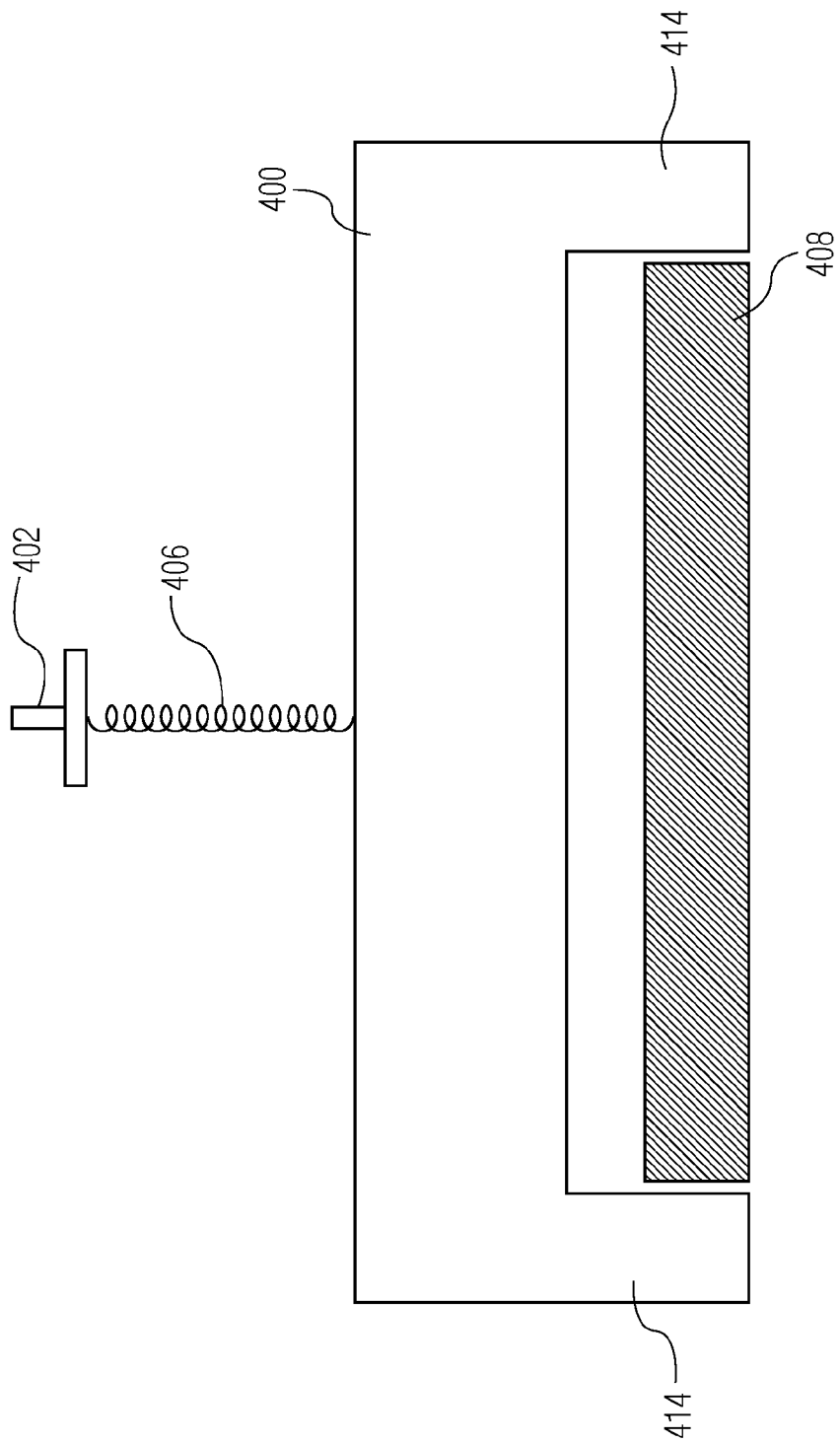
FIGS. 4A-4C are side block diagram views of portions of bonding systems according to various exemplary embodiments of the present invention.
Figure 4B:
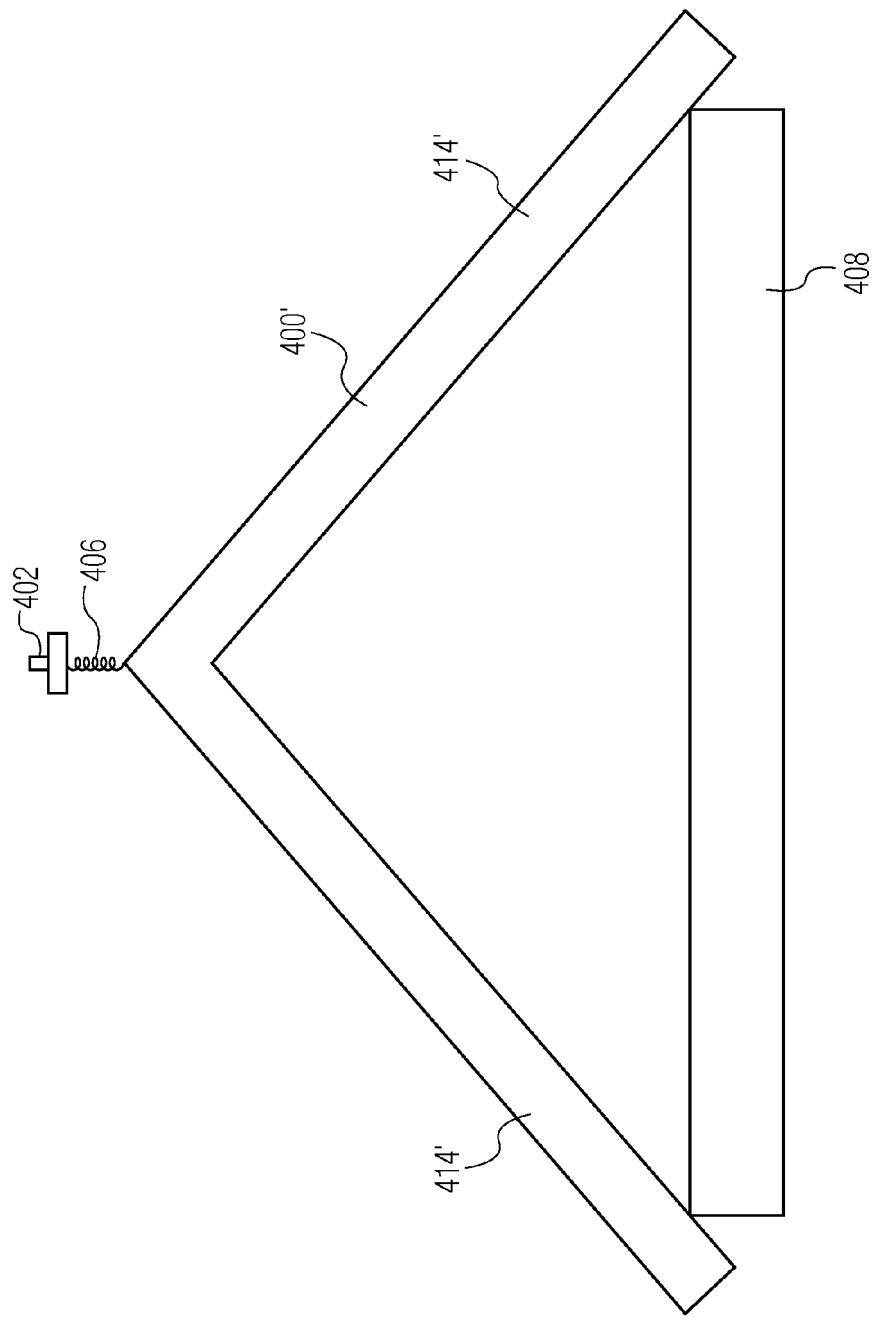
Figure 4C:
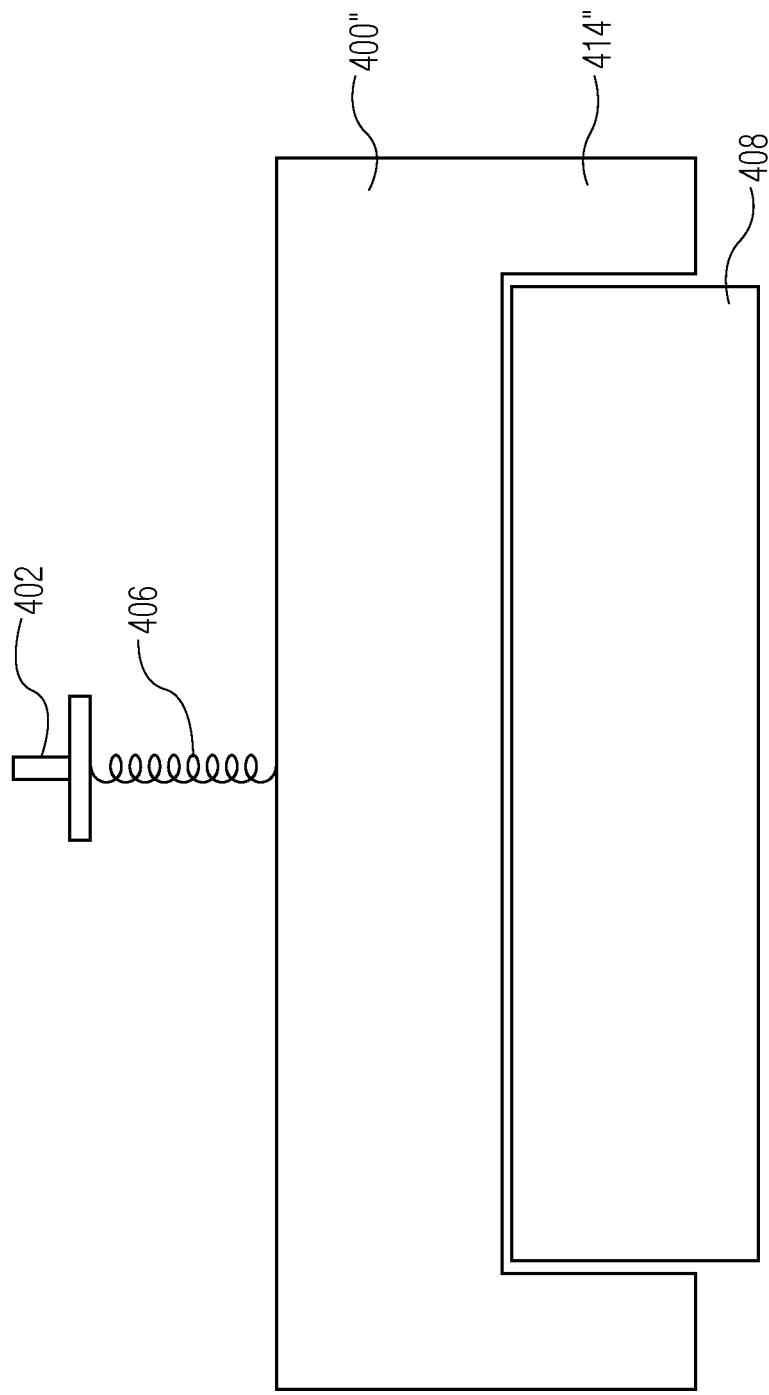

FIGS. 4A-4C illustrate exemplary ribbon aligning members 400, 400', 400" adapted to align a ribbon to be bonded. Ribbon aligning members 400, 400', 400" may be spaced apart from any pressing member/pressing elements (e.g., pressing members 204, 304 and pressing elements 310', 310", 310''') along the length of a ribbon to be bonded (e.g., see ribbon aligning members 518 in FIG. 5 positioned apart from pressing elements 512 along the length of ribbon 508). It is noted that this ribbon alignment function may also be incorporated into exemplary pressing members 204, 304 and exemplary pressing elements 310', 310", 310''' as will be discussed below in relation to FIG. 5. Ribbon aligning members 400, 400', 400" capture and align portions of ribbon 408 along a predetermined path. This predetermined path may effectively center ribbon 408 along an underlying busbar, for example, prior to bonding of ribbon 408 by a bonding tool to the underlying busbar. Respective compression members 406 (e.g., a spring) may be interposed between ribbon aligning members 400, 400', 400" and actuator 402 (that may, or may not, be carried by a bond head assembly). Further, different compression members (e.g., flexures) may be utilized. Further still, no compression member may be utilized if desired (e.g., in embodiments where no compression member may be desired such as when the actuator is a voice coil, a pneumatic actuator, etc. as desired by the user).

As illustrated in FIG. 4A, ribbon aligning member 400 includes opposing pair of leg portions 414 and is adapted to overlie ribbon 408 at a respective position(s) distal from an intended ribbon bonding site. Leg portions 414 define an essentially rectangular opening for receipt of ribbon 408.

As illustrated in FIG. 4B, ribbon aligning member 400' includes leg portions 414' that define an inverted V-shape for receipt of ribbon 408. This inverted V-shape may assist in receiving an out-of-alignment ribbon 408, and guiding it so as to be centered within ribbon aligning member 400'.

As illustrated in FIG. 4C, ribbon aligning member 400" has a similar overall shape as ribbon aligning member 400 except that opposing member leg portions 414" have a shortened length such that the thickness of ribbon 408 is not entirely received within the opening of ribbon aligning member 400".

As one skilled in the art would appreciate, ribbon aligning members 400, 400', 400" may act as a second pair of pressing members that are adapted to contact active areas of the substrate supporting ribbon 408. That is, the aligning members may be adapted to contact current fingers and/or a portion of the active area between the current fingers.

Figure 5:
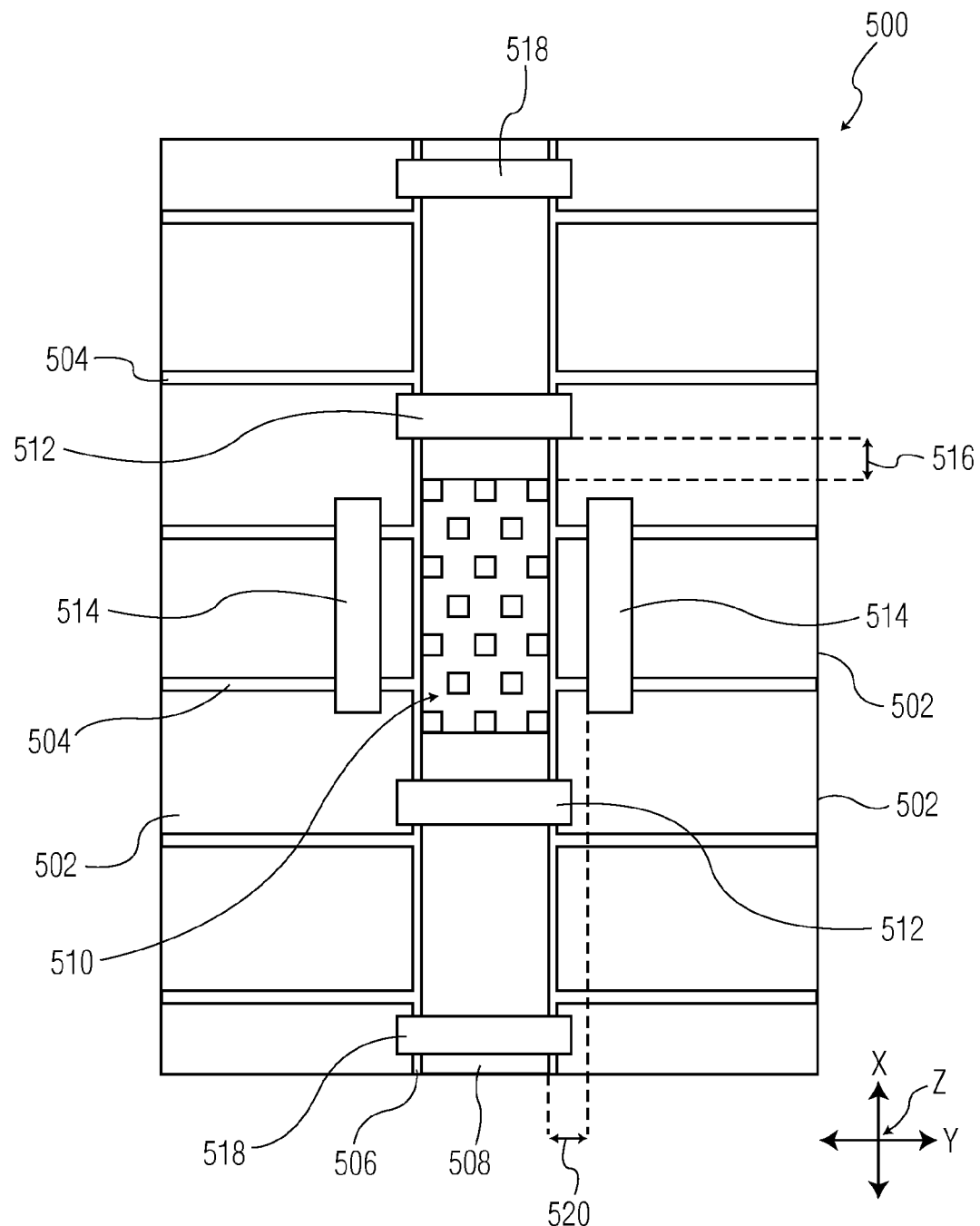
FIG. 5 is a plan, overhead block diagram view of a bonding system according to an exemplary embodiment of the present invention.

FIG. 5 illustrates a plan, block diagram view of a portion of substrate 500 (e.g., a solar substrate) having busbar 506 upon which ribbon 508 (e.g., an Al ribbon, a Cu ribbon, an Al—Cu clad ribbon, Ag ribbon, Ag—Cu clad ribbon, Ag—Al clad ribbon, etc.) is bonded. Solar substrate 500 includes cells or active areas 502 separated by current fingers 504 that direct current generated by cells 502 to busbar 506 that runs essentially perpendicular to current fingers 504. Ribbon 508 is positioned over and along busbar 506 and is bonded to busbar 506 at bond area 510 (also referred to as bond 510), one of which is illustrated in FIG. 5. A pressing member, carried by a bond head assembly, includes ribbon pressing elements 512, current finger/active area pressing elements 514, and ribbon aligning members 518 (that align ribbon 508 before bonding). A bonding tool (not shown), also carried by the bond head assembly, but operated independently of the pressing member, is used to form bond 510 on ribbon 508.

Ribbon (first) pressing elements 512 contact a portion of ribbon 508 proximate the bonding tool and bond 510. Exemplary ranges of distance 516 in the XY plane from the tip portion of the bonding tool (where the bonding tool, not shown, would be positioned directly above bond 510) to the closest portion of at least one of first pressing elements 512 may be from about 0.05 to 5.00 mm, or from about 0.20 to 1.50 mm. Current finger/cell (second) pressing elements 514 contact (1) a portion of cell 502 between pair of current fingers 504 and proximate the bonding tool and bond 510, and/or (2) a portion of pair of current fingers 504 proximate bond 510. Exemplary ranges of distance 520 in the XY plane from the tip portion of the bonding tool (where the bonding tool, not shown, would be positioned directly above bond 510) to a closest portion of at least one second pressing element 514 may be from about 0.10 to 5.00 mm, or from about 0.50 to 2.00 mm. Ribbon aligning members 518 are distal from first pressing elements 512 and contact portions of ribbon 508 such that ribbon 508 is essentially centered along a predetermined path (e.g., along a length of busbar 506) prior to, and during, bonding of ribbon 508 to busbar 506.

Pressing elements 512, 514 may be comprised of steel, hardened steel, stainless steel, tungsten-carbide, ceramic, amongst many other materials. If pressing elements 514 are adapted to contact portions of cell/active areas 502, second elements 514 (or at least a bottom surface of elements 514) may be formed of a material (e.g., a soft material) that would not damage those contacted portions of cell/active areas 502.

Pressing elements 512, 514 may have any desired shape or configuration. For example, pressing elements 512, 514 may be configured as described above in connection with the pressing elements of the pressing members of FIGS. 3A-3D. Further, pressing elements 512, 514 may have a shape similar to the ribbon aligning members illustrated in FIGS. 4A-4C and, depending upon their position with respect to the ribbon material, may be used as ribbon alignment members.

As will be appreciated by those skilled in the art, a pressing member may include any combination of ribbon pressing elements, current finger/cell pressing elements, and ribbon alignment members including, for example: (1) ribbon pressing elements 512; (2) ribbon pressing elements 512, and ribbon aligning members 518; (3) ribbon pressing elements 512 that incorporate the ribbon alignment function of ribbon aligning member 518; (4) current finger/cell pressing elements 514; (5) ribbon alignment pressing elements 512 and current finger/cell pressing elements 514; or (6) all three of ribbon pressing elements 512, ribbon aligning members 518, and current finger/cell pressing elements 514.

The ribbon aligning functions of ribbon aligning members 518 may be integrated into ribbon pressing elements 512. In such a case modified elements 512 may be brought into contact with ribbon 508 to align ribbon 508 as described above. At this time, modified elements 512 may act as a guide only, or may also be used as pressing elements which apply a downward force against ribbon 508 to busbar 506. Then, elements 514 may be lowered into contact with substrate 500, and then the bonding tool is used to bond ribbon 508 to bond area 510. If modified elements 512 were previously only used as a guide member, then now they may be pressed further downward as a ribbon pressing element prior to bond tool lift off. Then the bond tool lift off may be accomplished without damage to the ribbon and/or substrate.

In a further exemplary embodiment of the present invention, a method of bonding a ribbon to a substrate is provided. Using FIG. 5 as an example, the method may include a step of contacting a portion of ribbon 508 (overlying busbar 506) with a tip portion of a bonding tool (not shown). Ultrasonic energy may be applied to the bonding tool to form bond 510 between ribbon 508 and busbar 506. Pressing elements 512 may be brought into contact with portions of ribbon 508 proximate the tip portion of the bonding tool. Such contact may be maintained between pressing elements 512 and ribbon 508 while lifting the bonding tool up from bond 510 until the bonding tool no longer contacts bond 510. Pressing elements 512 may then be lifted from the contacted portions of ribbon 508.

Figure 8:
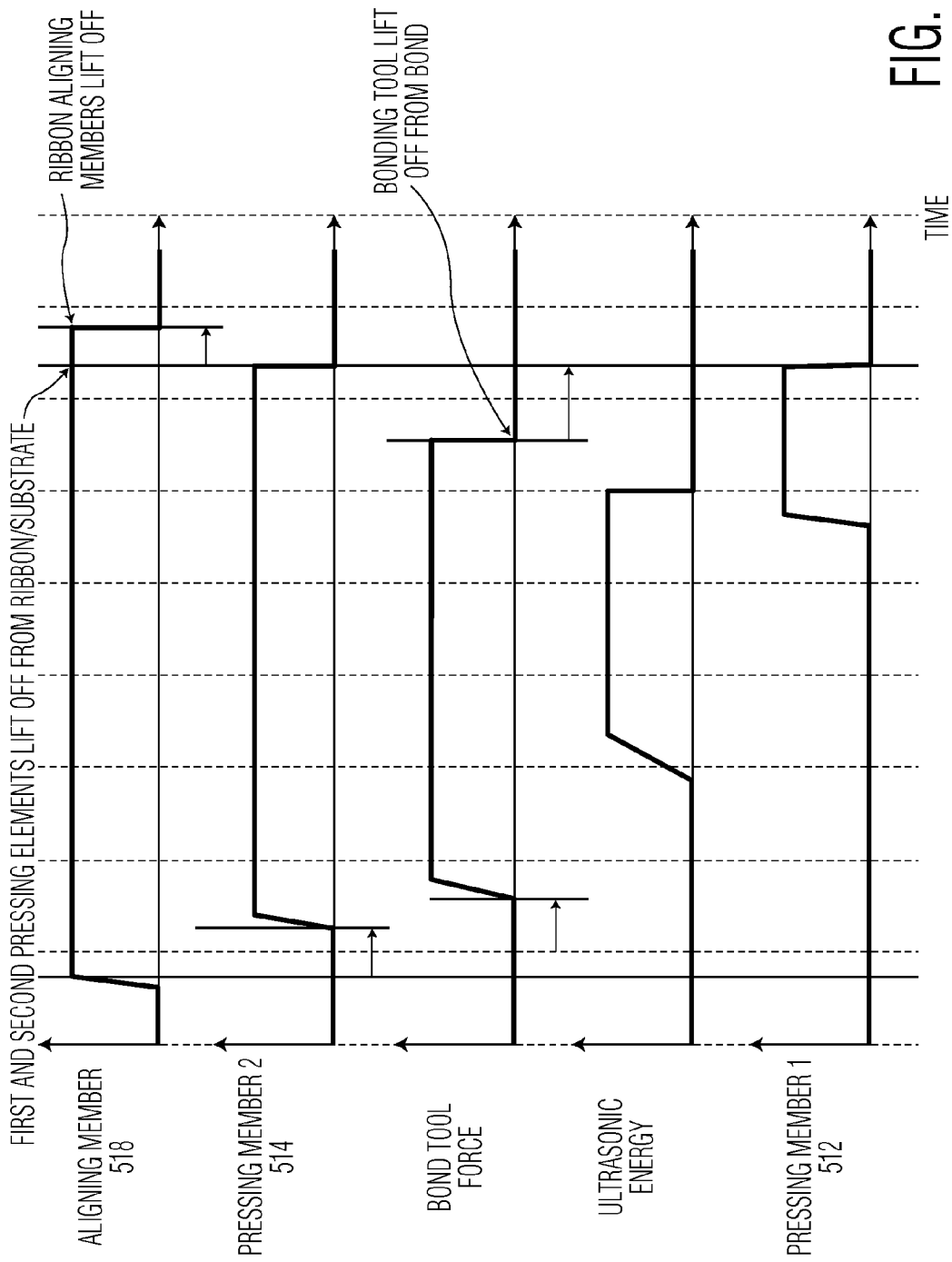
FIG. 8 is series of timing diagrams related to an ultrasonic bonding operation in accordance with an exemplary embodiment of the present invention.

FIG. 8 illustrates timing diagrams for various elements/characteristics of an exemplary bonding process. More specifically, timing diagrams for the motions/actions of aligning member(s) 518, pressing element(s) 514, bond tool force, ultrasonic energy, and pressing element(s) 512 are provided. First, ribbon aligning members 518 align ribbon 508 along a predetermined path (e.g., along busbar 506). Second, current finger/cell pressing (second) elements 514 contact portions of finger cells and/or portions of cell 502. Second elements 514 may tend to reduce any vibrations of substrate 500 proximate bonds (bond area) 510 which would tend to increase relative motion between ribbon 508 and busbar 506 during application of ultrasonic energy.

Third, bonding force is applied by the bonding tool being brought down and into contact with ribbon 508. Fourth, ultrasonic energy is then applied to the bonding tool so that the tip portion and the underlying portion of ribbon 508 vibrate in either the X or the Y direction. The bonding tool may vibrate in the X direction (along the length of ribbon 508, parallel to busbar 506), or may vibrate in the Y direction (perpendicular to ribbon 508 and busbar 506), or may vibrate in another direction as desired. It will be appreciated that applying ultrasonic vibration perpendicular to the busbar 506 (and ribbon 508), as opposed to along the length of ribbon 508, may offer an advantage of creating larger bonded areas without a higher power ultrasonic system.

Fifth, ribbon pressing (first) elements 512 of the pressing member are lowered and brought into contact with portions of ribbon 508 proximate the tip portion of the bonding tool. In FIG. 8 first elements 512 are brought into contact before the ultrasonic energy is turned off (but after bonds 510 have essentially been formed); however, it is understood that elements 512 may be brought into contact after the ultrasonic energy has been turned off. Then, the tip portion is raised in the Z direction to separate the tip portion from bond 510. By maintaining contact between pressing elements 512, 514 and ribbon 508 (as well as any other contacted portion of the substrate) potential for damage is reduced even if the tip portion has bonded to ribbon 508, and even if an appreciable force is used to break such a bond. After removal of the tip portion of the bonding tool from ribbon 508, elements 514, 512 are lifted off the corresponding portions of current fingers 504, cell 502, and ribbon 508. Finally, ribbon aligning members 518 are then lifted off the contacted portions of ribbon 508. The bond head assembly may then be moved by the XY table to a location for another ribbon bond formation and the process may continue.

It should be understood that the sequence illustrated in FIG. 8 is exemplary in nature, and variations are contemplated. For example, pressing members 512 may be brought into contact with portions of ribbon 508 at any desired point in time such as: before ultrasonic energy is applied to form bond 510; simultaneous with the application of the ultrasonic energy; after initiation of the ultrasonic energy but prior to the ultrasonic energy being turned off; after the ultrasonic energy is turned off; etc.

FIG. 5 has been described in connection with a top surface of solar substrate 500 (where active areas 502 are visible). The present invention may also be used in connection with ultrasonic bonding on the back side of a solar substrate. For example, such a back side may be a solid conductive surface (e.g., an Al surface) because such a surface is not used to convert light energy, but to conduct current and reflect light that otherwise would be lost after passing through the cell. Ribbons may be ultrasonically bonded to this back side as is desired in the application. For example, back side ribbons may be bonded opposite ribbons 508 bonded to the front side of substrate 500 shown in FIG. 5. In such a case, ribbon aligning members 518 may be useful in ensuring proper backside ribbon alignment.

Figure 6:
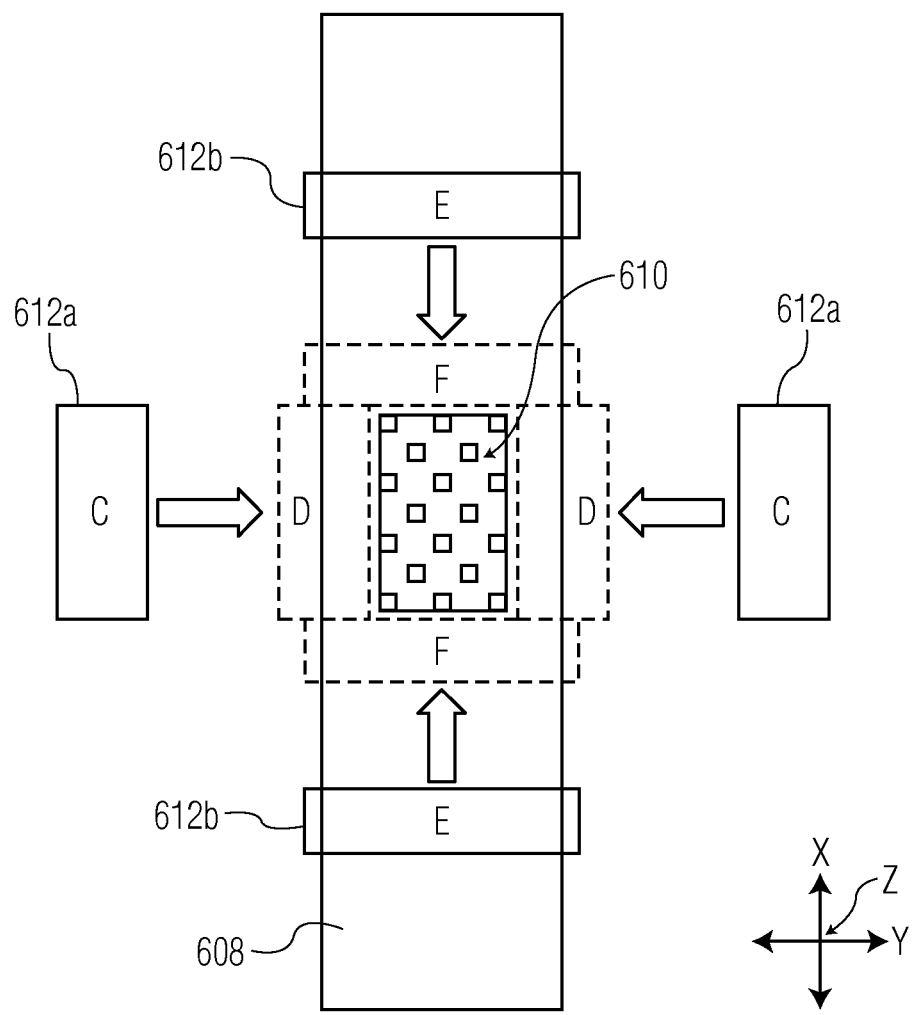
FIG. 6 is a plan, overhead block diagram view of another bonding system according to an exemplary embodiment of the present invention.

FIG. 6 is a plan, overhead view of a ribbon and two pairs of ribbon pressing elements. First and second pairs of ribbon pressing elements 612a, 612b are at first respective positions C, E spaced apart from the bonding tool (not shown, but generally positioned above bond area 610). Elements 612a, 612b are adapted to move downwardly and inwardly (e.g., along an angled path, or through stepped motions) towards the tip portion of the bonding tool, that is, towards bond area 610, so as to contact ribbon 608 at respective positions D, F (shown in dashed lines). First and second pairs of ribbon pressing elements 612a, 612b could be actuated through any type of device such as, for example, a cam actuator.

Figure 7:
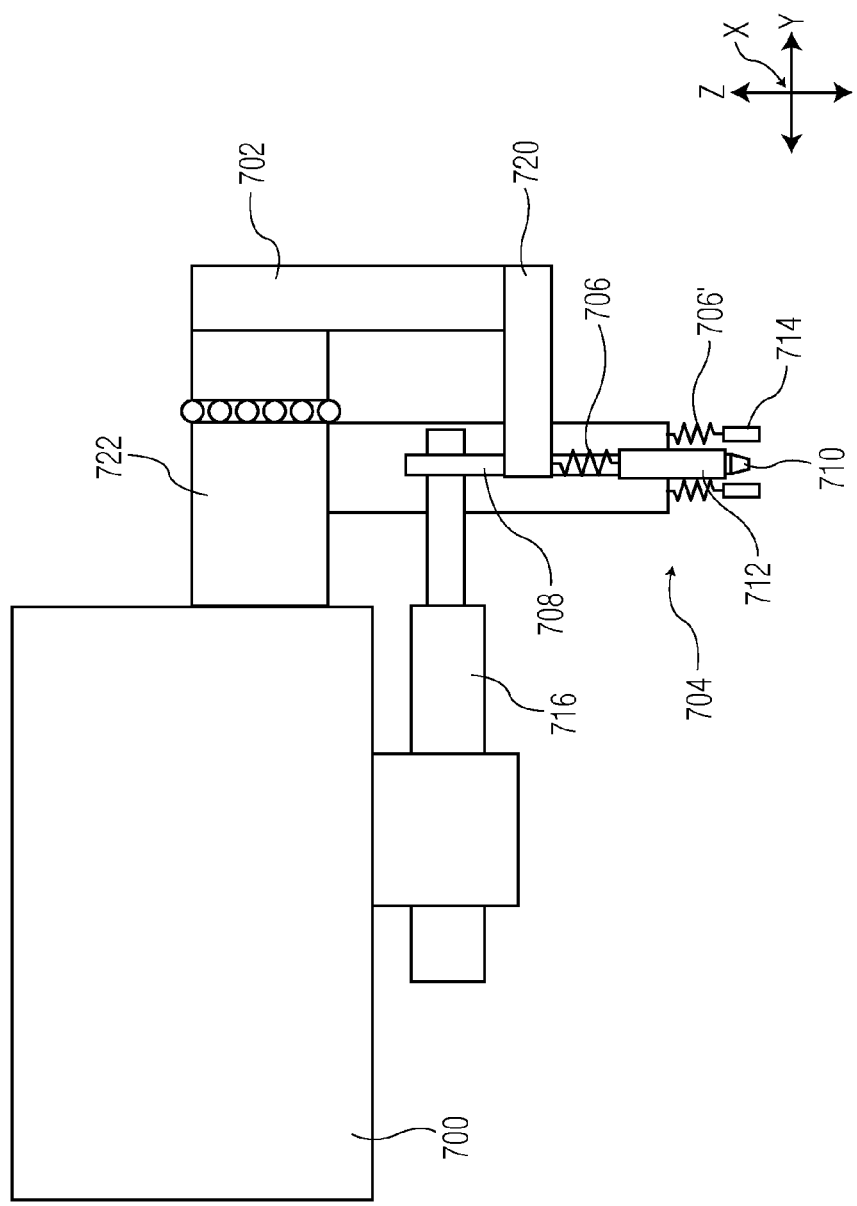
FIG. 7 is a side block diagram view of another bonding system according to an exemplary embodiment of the present invention.

FIG. 7 is a side, block diagram view of a bond head assembly carrying a bonding tool and a pressing member including two pairs of pressing elements in accordance with an exemplary embodiment of the present invention. Transducer 716 is carried by bond head assembly 700 and imparts ultrasonic energy to bonding tool 708 that includes tip portion 710. Actuator 702 is also carried by bond head assembly 700. Actuator 702 and bonding tool 708 may move independently of one another in the Z direction. Further, pressing member 704 includes ribbon pressing elements 712 (only a front element 712 is visible as a back element 712 is blocked from view) and current finger/cell pressing elements 714. First compression members 706 are interposed between ribbon pressing elements 712 and first portion 720 of actuator 702, that may (or may not) be separately moveable in the Z direction from second portion 722 of actuator 702 from which second compression members 706' are interposed to current finger/cell pressing elements 714. Although not shown, ribbon aligning members may be provided as desired. Such ribbon aligning members may be carried by the bond head assembly (with or without an interposed compression member).

In one or more exemplary embodiments of the present invention, compression members 206', 306, 306', 306", 406, 706, 706' (actuated by respective actuators 202, 302, 402, 702 (720, 722)) may create a press down force of between about 500 to 10,000 grams, with another exemplary range of between about 1,000 to 5,000 grams.

In certain ultrasonic bonding applications, forming a subsequent bond in a ribbon may actually weaken a bond previously formed in the same ribbon (e.g., a bond that is a few millimeters away). During formation of the subsequent bond, ultrasonic vibration may propagate along the ribbon, thereby weakening the previously formed bond. Certain aspects of the present invention may be used to alleviate or reduce the potential for such weakening of previously formed bonds. For example, a pressing element(s) or the like (e.g., carried by the bond head assembly), may be used to press against a location along the length of the ribbon between the previously formed bond and the subsequent bond to be formed. For example, such functionality could be achieved (1) using a type of pressing member such as those disclosed herein, (2) using an aligning member (which may be particularly desirable based on a location at an anti-node) such as those disclosed herein, such as in FIG. 4C, or (3) other types of pressing elements.

Various aspects of the present invention may have particular applicability to the formation of ribbon bonds between adjacent solar cells. In a first example, a length(s) of conductive ribbon may be bonded between a front side (where the front side includes active solar material for absorbing light and converting the light into electrical energy) of a first solar cell and a front side of an adjacent solar cell. In a second example, a length(s) of conductive ribbon may be bonded between a back side (where the back side does not include active solar material) of a first solar cell and a back side of an adjacent solar cell.

In a third example, a length(s) of conductive ribbon may be bonded between a front side of a first solar cell and a back side of an adjacent solar cell. For example, a first solar cell may have a ribbon bonded to its back side, where a free portion of the bonded ribbon extends past the footprint of the first solar cell. A second adjacent solar cell may have a ribbon bonded to its front side (e.g., along a busbar or the like). It may be desired to bond (1) the ribbon extending from the front side of the second cell, to (2) the free portion of the ribbon bonded to the back side of the first cell. Of course, the opposite operation may also be performed (e.g., bonding a ribbon extending from the back side of a second cell to a free portion of another ribbon bonded to the front side of a first cell).

Various aspects of the present invention, such as the use of pressing elements or the like (e.g., carried by a bond head assembly), may be used in such solar cell interconnection processes. For example, referring to the third example above, a pressing element(s) may press against (1) the free portion of the ribbon of the first solar cell during the bonding process, (2) the ribbon extending from the front side of the second cell, or both. This bonding between the two adjacent cells may be accomplished (1) independent of the other bonding operations (e.g., independent of the bonding of the ribbon to the front side of the second cell, and even on a different system), or (2) in connection with at least one of the other bonding operations (e.g., in connection with the bonding of the ribbon to the front side of the second cell, using the same bonding system).

As provided above, various aspects of the present invention may be used in connection with bonding in a direction along the length of the ribbon material, and/or perpendicular to the length of the ribbon material. For example, using a rotatable bond head allows for the bonding direction (e.g., scrubbing direction) to be changed. That is, referring to the example shown in FIG. 5, in one example, elements 512 press against a ribbon material, while elements 514 press against the current fingers or other substrate portions. When the bond head is rotated, the function of elements 512 and 514 may be reversed. When applying such a system to the formation of bonds between two cells, it is understood that, depending upon the system configuration (and the bonding direction), elements such as 512 or 514 (or others not shown in FIG. 5) may press against the free ribbon and/or relevant portion of the ribbon extending from the front side of the second cell.

Although the present invention has been described primarily in terms of solar cell bonding applications (e.g., crystalline silicon solar cells, thin film solar cells, etc.), it is not limited thereto. The teachings of the present invention have application in any of a number of ultrasonic bonding applications (e.g., wire or ribbon bonding in for semiconductor devices such as in connection with lead frame structures used to build small discrete packages, in connection with other semiconductor devices, in connection with power semiconductor devices, etc.) such as applications where bonding is more difficult, for example, because the substrate tends to vibrate with the bonding tool (e.g., because of insufficient clamping of the substrate), or the substrate is not very stiff or is fragile (e.g., foil).

Various aspects of the present invention have been described in connection with a pressing member (and/or pressing elements) that is moveable with respect to a bond head assembly (e.g., using an actuator or the like); however, the present invention is not limited thereto. The teachings of the present invention may also be applied to a "passive" pressing member (and/or pressing elements) that is carried by a bond head assembly (e.g., the z-axis assembly of the bond head assembly) but are not moveable with respect to the bond head assembly. In such embodiments, motion of the bond head assembly would be used to position such pressing member(s) (and/or pressing elements). Otherwise, the teachings herein, including the functionality and exemplary configurations of the pressing members (and/or pressing elements) are applicable to such a "passive" configuration. Such exemplary embodiments of the present invention would of course change the operational sequence described above because the pressing member(s)/element(s) may contact the ribbon material before (or simultaneous with) contact between the ribbon material and the bonding tool.

Further, in certain embodiments of the present invention, a pressing member(s)/element(s) may be carried by another element of a bond head assembly. In one example, the pressing member(s) may be at least partially carried by the bonding tool itself. For example, the pressing member(s)/element(s) may be clipped or otherwise attached to the bonding tool. In such an example, motion of the bonding tool also moves the pressing member/element, and as such, collapsible pressing members/elements may be utilized in order to provide the desired functionality.

The various ribbon aligning members described herein may be carried by the bond head assembly but the present invention is not limited thereto. Rather, ribbon aligning members having the same (or similar) functionality to those described herein may be carried but the XY table of the ribbon bonding system, but not carried by the bond head assembly. In such an example, the pressing member(s)/element(s) may also be carried by the XY table but not the bond head assembly. Further still, in such an example, the pressing member(s)/element(s) may also be carried by the ribbon aligning member(s).

As will be appreciated by those skilled in the art, the selected mounting configuration of the ribbon aligning member(s) may dictate what hardware is to be utilized. In a ribbon bonding system where the ribbon aligning member(s) are carried by an XYZT bond head assembly (i.e., a motion system for the x-axis, y-axis, z-axis, and theta axis), it may not be necessary to include a separate z-axis actuator (or other motion mechanism) for the ribbon aligning member. However, if the ribbon aligning member(s) are carried by an XY table (i.e., without z-axis motion), it may be necessary to include a separate z-axis actuator (or other motion mechanism) for the ribbon aligning member.

As will be appreciated by those skilled in the art, a ribbon cutting mechanism may also be provided for at least partially cutting the ribbon material following a ribbon bonding operation. Such a cutting mechanism may be carried by a bond head assembly (e.g., XYZT bond head assembly) or as desired in the given application. Such a ribbon cutting mechanism may be a front side ribbon cutting mechanism (e.g., where additional ribbon is fed after bond formation to position the cutting mechanism at the desired cutting position) or a back side ribbon cutting mechanism (e.g., where ribbon is not fed after bond formation because the cutting mechanism is already properly positioned). Further, the ribbon cutting process may be conducted during varying times of the ribbon bonding cycle (e.g., after application of ultrasonic energy to form a ribbon bond, after application of ultrasonic energy but before lifting of the ribbon bonding tool after formation of the ribbon bond, after application of ultrasonic energy and after lifting of the ribbon bonding tool such as during a front side ribbon cutting process, etc.).

In any of the embodiments of the present invention where a plurality of pressing members/elements are provided, the members/elements may be individually moved by a single actuator (e.g., a z-axis actuator), or may be moved by separate actuators.

The pressing members/elements of any of the embodiments of the present invention may be configured with an adjustment mechanism to adjust the contact portion (e.g., foot) of the member/element that will contact the substrate. That is, it may be desirable to ensure that the foot of the pressing member is substantially parallel to the portion of the substrate that it will contact. An adjustment mechanism may be included to provide this desired benefit. The adjustment mechanism may be a passive mechanism (e.g., a compliant leveling member, etc.) or may be automated as desired.

Through the various exemplary embodiments of the present invention illustrated and described herein, it shall be appreciated that certain elements may be removed as desired. For example, compression members illustrated in the various drawings may be omitted if desired in certain applications.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An ultrasonic bonding system comprising:
a bond head assembly;
a conductive bonding material configured to be bonded to a workpiece;
a bonding tool for bonding the conductive bonding material to the workpiece, the bonding tool being supported by the bond head assembly;
a pressing member, including a plurality of pressing elements, adapted to press against the conductive bonding material when the conductive bonding material is in contact with the workpiece, the pressing member being supported by the bond head assembly and being moveable with respect to the bond head assembly independent of the bonding tool; and
an actuator adapted to move the pressing member, including the plurality of pressing elements, into and out of contact with the conductive bonding material.

2. The system of claim 1 wherein the plurality of pressing elements includes pressing elements positioned on opposing sides of the bonding tool.

3. The system of claim 2 further comprising a compression member disposed between the actuator and the pressing member, the compression member including a spring member or a pneumatic member adapted to compress upon contact between the pressing member and the conductive bonding material at a certain force applied by the actuator.

4. The system of claim 1 wherein the plurality of pressing elements includes first pressing elements proximate opposing sides of the bonding tool, the first pressing elements being adapted to press against the conductive bonding material.

5. The system of claim 1 wherein the plurality of pressing elements further includes second pressing elements situated approximately 90 degrees from the first pressing elements and on other opposing sides of the bonding tool.

6. The system of claim 5 wherein the second pressing elements each include a lower surface adapted to contact portions of the workpiece that includes an element to which the conductive bonding material is bonded.

7. The system of claim 5 wherein a distance in an XY plane between a tip portion of the bonding tool and (1) a closest portion of at least one of the first pressing elements is from about 0.05 to 5.00 mm, and (2) a closest portion of at least one of the second pressing elements is from about 0.10 to 5.00 mm.

8. The system of claim 5 wherein a distance in an XY plane between a tip portion of the bonding tool and (1) a closest portion of at least one of the first pressing elements is from about 0.20 to 1.50 mm, and (2) a closest portion of at least one of the second pressing elements is from about 0.50 to 2.00 mm.

9. An ultrasonic bonding system comprising:
a bond head assembly;
a conductive bonding material configured to be bonded to a workpiece;
a bonding tool for bonding the conductive bonding material to the workpiece, the bonding tool being supported by the bond head assembly; and
a pressing member adapted to press against the conductive bonding material when the conductive bonding material is in contact with the workpiece, the pressing member being supported by the bond head assembly and being moveable with respect to the bond head assembly independent of the bonding tool using an actuator, wherein the pressing member defines an opening through which the bonding tool extends during a bonding operation.

10. The system of claim 9 wherein the pressing member completely surrounds a portion of the bonding tool.

11. The system of claim 10 wherein the pressing member has a round or rectangular shape.

12. The system of claim 1 wherein the pressing member has a lower surface adapted for contact with an upper surface of the conductive bonding material.

13. The system of claim 1 wherein a closest portion edge of the pressing member is spaced from a tip portion of the bonding tool in an XY plane by about 0.05 to 5.00 mm.

14. An ultrasonic ribbon bonding system comprising:
a bond head assembly;
a conductive ribbon material configured to be bonded to a workpiece;
a ribbon bonding tool supported by the bond head assembly;
a pressing member, including a plurality of pressing elements, adapted to press against the conductive ribbon material bonded using the ribbon bonding tool, the pressing member being supported by the bond head assembly and being moveable with respect to the bond head assembly independent of the ribbon bonding tool; and
an actuator adapted to move the pressing member, including the plurality of pressing elements, into and out of contact with the conductive bonding material.

15. The system of claim 14 wherein the plurality of pressing elements includes pressing elements positioned on opposing sides of the bonding tool.

16. The system of claim 15 further comprising a compression member disposed between the actuator and the pressing member, the compression member including a spring member or a pneumatic member adapted to compress upon contact between the pressing member and the conductive ribbon material at a certain force applied by the actuator.

17. The system of claim 1 wherein the plurality of pressing elements includes first pressing elements proximate opposing sides of the ribbon bonding tool, the first pressing elements being adapted to press the conductive ribbon material against the workpiece.

18. The system of claim 17 wherein the plurality of pressing elements further includes second pressing elements situated approximately 90 degrees from the first pressing elements and proximate other opposing sides of the ribbon bonding tool.

19. The system of claim 18 wherein the second pressing elements each include a lower surface adapted to contact portions of the workpiece that includes an element to which the conductive ribbon material is bonded.

20. The system of claim 18 wherein a distance in an XY plane between a tip portion of the ribbon bonding tool and (1) a closest portion of at least one of the first pressing elements is from about 0.05 to 5.00 mm, and (2) a closest portion of at least one of the second pressing elements is from 0.10 to 5.00 mm.

21. The system of claim 18 wherein a distance in an XY plane between a tip portion of the ribbon bonding tool and (1) a closest portion of at least one of the first pressing elements is from about 0.20 to 1.50 mm, and (2) a closest portion of at least one of the second pressing elements is from 0.50 to 2.00 mm.

22. An ultrasonic ribbon bonding system comprising:
a bond head assembly;
a conductive ribbon material configured to be bonded to a workpiece;
a ribbon bonding tool supported by the bond head assembly; and
a pressing member adapted to press against the conductive ribbon material bonded using the ribbon bonding tool, the pressing member being supported by the bond head assembly and being moveable with respect to the bond head assembly independent of the ribbon bonding tool using an actuator, wherein the pressing member defines an opening through which the ribbon bonding tool extends during a bonding operation.

23. The system of claim 22 wherein the pressing member completely surrounds a portion of the ribbon bonding tool.

24. The system of claim 23 wherein the pressing member has a round or rectangular shape.

25. The system of claim 15 wherein the pressing member has a lower surface adapted for contact with an upper surface of the conductive ribbon material.

26. The system of claim 15 wherein a closest portion edge of the pressing member is spaced from a tip portion of the ribbon bonding tool in an XY plane by about 0.05 to 5.00 mm.

27. The system of claim 18 further comprising ribbon material aligning elements carried by the bond head assembly and spaced apart from the first pressing elements, the ribbon material aligning elements being adapted for aligning the conductive ribbon material along a predetermined path.

28. A solar cell ribbon bonding system for bonding a conductive ribbon material to portions of a solar cell, the solar cell ribbon bonding system comprising:

a bond head assembly;
a conductive ribbon material configured to be bonded to a workpiece;
a ribbon bonding tool supported by the bond head assembly;
a pressing member, including a plurality of pressing elements, adapted to press against the conductive ribbon material bonded using the ribbon bonding tool, the pressing member being supported by the bond head assembly and being moveable with respect to the bond head assembly independent of the ribbon bonding tool; and
an actuator adapted to move the pressing member into and out of contact with the conductive ribbon material.

29. The system of claim 28 wherein the plurality of pressing elements includes pressing elements positioned on opposing sides of the bonding tool.

30. The system of claim 29 further comprising a compression member disposed between the actuator and the conductive ribbon material, the compression member including a spring member or a pneumatic member adapted to compress upon contact between the pressing member and the conductive ribbon material at a certain force applied by the actuator.

31. The system of claim 28 wherein the plurality of pressing elements include a first pair of pressing elements proximate opposing sides of the ribbon bonding tool, the first pair of pressing elements being adapted to press the conductive ribbon material against the workpiece during bonding.

32. The system of claim 31 wherein the plurality of pressing elements further includes a second pair of pressing elements situated approximately 90 degrees from the first pair of pressing elements and proximate other opposing sides of the ribbon bonding tool.

33. The system of claim 32 wherein the second pair of pressing elements has lower surfaces adapted to contact portions of the workpiece that includes an element to which the conductive ribbon material is bonded.

34. The system of claim 32 wherein a distance in an XY plane between a tip portion of the ribbon bonding tool and (1) a closest portion of at least one of the first pair of pressing elements is from about 0.05 to 5.00 mm, and (2) a closest portion of at least one of the second pair of pressing elements is from 0.10 to 5.00 mm.

35. The system of claim 32 wherein a distance in an XY plane between a tip portion of the ribbon bonding tool and (1) a closest portion of at least one of the first pair of pressing elements is from about 0.20 to 1.50 mm, and (2) a closest portion of at least one of the second pair of pressing elements is from 0.50 to 2.00 mm.

36. A solar cell ribbon bonding system for bonding a conductive ribbon material to portions of a solar cell, the solar cell ribbon bonding system comprising:
a bond head assembly;
a conductive ribbon material configured to be bonded to a workpiece;
a ribbon bonding tool supported by the bond head assembly;
a pressing member, including a plurality of pressing elements, adapted to press against the conductive ribbon material bonded using the ribbon bonding tool, the pressing member being supported by the bond head assembly and being moveable with respect to the bond head assembly independent of the ribbon bonding tool using an actuator, wherein the pressing member defines an opening through which the ribbon bonding tool extends during a bonding operation.

37. The system of claim 36 wherein the pressing member completely surrounds a portion of the ribbon bonding tool.

38. The system of claim 37 wherein the pressing member has a round or rectangular shape.

39. The system of claim 28 wherein the pressing member has a lower surface adapted for contact with an upper surface of the conductive ribbon material.

40. The system of claim 28 wherein a closest portion edge of the pressing member is spaced from a tip portion of the ribbon bonding tool in an XY plane by about 0.05 to 5.00 mm.

41. The system of claim 32 further comprising ribbon material aligning elements carried by the bond head assembly and spaced apart from the first pressing elements, the ribbon material aligning elements being adapted for aligning the conductive ribbon material along a predetermined path.

42. The system of claim 32 further comprising a solar cell having a busbar positioned along a length of the solar cell, the solar cell being the workpiece, the busbar being provided on an active area of the solar cell such that a plurality of active area portions are positioned on either side of the busbar, and a plurality of current fingers extending between ones of the active area portions and electrically connected to the busbar, the conductive ribbon material being positioned on the busbar for bonding thereto.

43. The system of claim 42, wherein the second pair of pressing elements are adapted to contact at least one of the active area portions and the plurality of current fingers.

44. The system of claim 42, wherein the second pair of pressing elements are adapted to contact the active area portions and the plurality of current fingers.

* * * * *